(12) United States Patent
Moriarty

(10) Patent No.: US 6,826,210 B2
(45) Date of Patent: Nov. 30, 2004

(54) POWER CONTROL CIRCUIT FOR LASER DIODE HAVING WAVELENGTH COMPENSATION

(75) Inventor: Daniel T. Moriarty, Hudson, MA (US)

(73) Assignee: Alcatel Communications, Inc., Plano, TX (US)

(*) Notice: Subject to any disclaimer, the term of this patent is extended or adjusted under 35 U.S.C. 154(b) by 0 days.

(21) Appl. No.: 10/213,278

(22) Filed: Aug. 6, 2002

(65) Prior Publication Data

US 2003/0026305 A1 Feb. 6, 2003

Related U.S. Application Data

(63) Continuation-in-part of application No. 09/877,921, filed on Jun. 7, 2001.

(51) Int. Cl.[7] .................................................. H01S 3/13
(52) U.S. Cl. ............................ 372/29.021; 372/29.015; 372/38.01
(58) Field of Search ...................... 372/29.021, 29.015, 372/29.014, 29.012, 29.011, 25, 34, 38.07, 31, 38, 32, 38.1, 29.01, 20–33, 38.02, 29.02, 29.016, 38.01

(56) References Cited

U.S. PATENT DOCUMENTS

| | | | | |
|---|---|---|---|---|
| 4,081,670 A | * | 3/1978 | Albanese | 372/38.07 |
| 4,345,330 A | * | 8/1982 | Howie et al. | 372/38.07 |
| 5,097,473 A | * | 3/1992 | Taguchi | 372/29.011 |
| 5,136,600 A | * | 8/1992 | Fidric et al. | 372/32 |
| 5,285,464 A | * | 2/1994 | Ogino | 372/38.07 |
| 5,299,212 A | * | 3/1994 | Koch et al. | 372/32 |
| 5,309,458 A | * | 5/1994 | Carl | 372/34 |
| 5,530,712 A | * | 6/1996 | Solina et al. | 372/31 |
| 5,563,898 A | * | 10/1996 | Ikeuchi et al. | 372/38.07 |
| 5,666,045 A | * | 9/1997 | Grodevant | 323/282 |
| 5,761,230 A | * | 6/1998 | Oono et al. | 372/38.01 |
| 5,881,081 A | * | 3/1999 | Hwang | 372/38.04 |
| 5,966,395 A | * | 10/1999 | Ikeda | 372/38.01 |
| 6,091,747 A | * | 7/2000 | Morita et al. | 372/38.02 |
| 6,192,060 B1 | * | 2/2001 | Kobayashi | 372/38.01 |
| 6,226,114 B1 | * | 5/2001 | Ashkeboussi et al. | 398/192 |
| 6,233,262 B1 | * | 5/2001 | Mesh et al. | 372/32 |
| 6,282,218 B1 | * | 8/2001 | Anderson | 372/38.02 |
| 6,320,890 B1 | * | 11/2001 | Taguchi | 372/38.02 |
| 6,369,926 B1 | * | 4/2002 | Lyu et al. | 398/95 |

* cited by examiner

Primary Examiner—Minsun Oh Harvey
Assistant Examiner—Tuan N. Nguyen
(74) Attorney, Agent, or Firm—Fish & Richardson, PC; Jessica W. Smith; V. Lawrence Sewell

(57) ABSTRACT

A control circuit includes a power controller for adjusting a bias current to a laser diode to change the power output of the laser diode, the change in power having a corresponding wavelength shift effect on the nominal operating wavelength of the laser diode and a monitoring circuit for sensing the bias current to the laser diode and for generating an output signal in response to the sensed bias current. The control circuit further includes a wavelength controller which receives the output signal from the monitoring circuit and in response to the output signal compensates for the wavelength shift such that the laser diode maintains operation at the nominal wavelength.

15 Claims, 6 Drawing Sheets

POWER CONTROL CIRCUIT FOR LASER DIODE HAVING WAVELENGTH COMPENSATION

RELATED APPLICATION

This application is a continuation-in-part and claims the benefit of priority under 35 USC § 120 of U.S. application Ser. No. 09/877,921, filed Jun. 7, 2001. The disclosure of the prior application is considered part of and is incorporated by reference in the disclosure of this application.

BACKGROUND OF THE INVENTION

Wavelength division multiplexed systems, in which multiple channels are carried at different wavelengths on the same optical fiber, require adjustable output power to address problems such as optical crosstalk between channels and power balancing of optical signals for optical amplifiers. It is common today to control the output power of a semiconductor laser diode to maintain a constant operational output level, for example, 0 dBm. The constant output power laser diode is used in combination with an optical attenuator to provide the adjustable output power that is needed. The type of optical attenuator can be either fixed or variable attenuation. The fixed attenuation type is neither field adjustable nor remotely controllable. The variable attenuation type is large and expensive and can require additional power sensing circuitry.

SUMMARY OF THE INVENTION

There is a need for an approach to controlling the output power of laser diodes that is less costly and less bulky than those that require external optical attenuators. There is also a need for a power control mechanism that takes into account the relationship between temperature and wavelength in the operation of laser diodes.

An apparatus and method of the present approach provides for electrical control of the laser output power without the need for a costly and bulky optical attenuator. The present approach further provides wavelength control to compensate for the relationship between laser diode operating temperature and wavelength.

Accordingly, a control circuit for a laser diode includes a power controller and a wavelength controller. The power controller adjusts a bias current to the laser diode to change the power output of the laser diode. The power change can have a corresponding wavelength shift effect on the nominal operating wavelength of the laser diode. The wavelength controller compensates for the wavelength shift such that the laser diode maintains operation at the nominal wavelength.

In an embodiment, the power controller includes a bias current source that provides an adjustable bias current to the laser diode. A power monitor loop includes a backfacet diode for monitoring the laser diode power output to provide a power monitor signal. A power control signal added to the power monitor signal provides a power adjust signal. The bias current source adjusts the bias current responsive to a difference between a power reference voltage input of the bias current source and the power adjust signal.

In an embodiment, the wavelength controller includes a temperature control circuit that provides a control current to a thermoelectric element for controlling the temperature operation point of the laser diode. A temperature monitor loop includes a temperature sensor for monitoring the temperature operation point to provide a temperature monitor signal. A wavelength compensation signal added to the temperature monitor signal provides a wavelength control signal. The temperature control circuit adjusts the control current to the thermoelectric element responsive to a difference between a temperature reference signal and the wavelength control signal.

The wavelength compensation signal may be proportional to the power control signal.

In an alternate embodiment, the wavelength controller includes an etalon element for wavelength compensation.

In one aspect of the invention, a control circuit includes a power controller for adjusting a bias current to a laser diode to change the power output of the laser diode, the change in power having a corresponding wavelength shift effect on the nominal operating wavelength of the laser diode and a monitoring circuit for sensing the bias current to the laser diode and for generating an output signal in response to the sensed bias current. The control circuit further includes a wavelength controller which receives the output signal from the monitoring circuit and in response to the output signal compensates for the wavelength shift such that the laser diode maintains operation at the nominal wavelength.

Embodiments of this aspect of the invention may include one or more of the following features. The monitoring circuit includes a sensing resistor. The power controller includes a bias current source that provides an adjustable bias current to the laser diode and has a power reference voltage input. The power controller also includes a power monitor loop having a backfacet diode for monitoring the laser diode power output to provide a power monitor signal, and a power control signal added to the power monitor signal to provide a power adjust signal. The bias current source adjusts the bias current responsive to a difference between the power reference voltage input and the power adjust signal.

The wavelength controller includes a temperature control circuit that provides a control current to a thermoelectric element for controlling the temperature operation point of the laser diode and having a temperature reference voltage input and a temperature monitor loop including a temperature sensor for monitoring the temperature operation point to provide a temperature monitor signal a wavelength compensation signal added to the temperature monitor signal to provide a wavelength control signal. The temperature control circuit adjusts the control current to the thermoelectric element responsive to a difference between the temperature reference voltage input and the wavelength control signal. The wavelength compensation signal is proportional to the sensed bias current.

The control circuit can further include the laser diode and a modulator for modulating the output of the laser diode.

In another aspect of the invention, a method of controlling a laser diode includes the following. A bias current to the laser diode is adjusted to change the power output of the laser diode, the power change having a corresponding wavelength shift effect on the nominal operating wavelength of the laser diode. The level of bias current to the diode is sensed. In response to the sensed level of bias current, compensating for the wavelength shift such that the laser diode maintains operation at the nominal wavelength.

Embodiments of this aspect of the invention may include one or more of the following steps. Adjusting the change of power output includes monitoring the laser diode power output to provide a power monitor signal, adding a power control signal to the power monitor signal to provide a power adjust signal, and adjusting the bias current responsive to a difference between a power reference voltage signal and the power adjust signal.

Compensating for the wavelength shift includes providing a control current to a thermoelectric element for controlling the temperature operation point of the laser diode, monitoring the temperature operation point to provide a temperature monitor signal, adding a wavelength compensation signal to the temperature monitor signal to provide a wavelength control signal, and adjusting the control current to the thermoelectric element responsive to a difference between a temperature reference signal and the wavelength control signal.

The details of one or more embodiments of the invention are set forth in the accompanying drawings and the description below. Other features, objects, and advantages of the invention will be apparent from the description and drawings, and from the claims.

BRIEF DESCRIPTION OF THE DRAWINGS

The foregoing and other objects, features and advantages of the invention will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION

Figure 1:
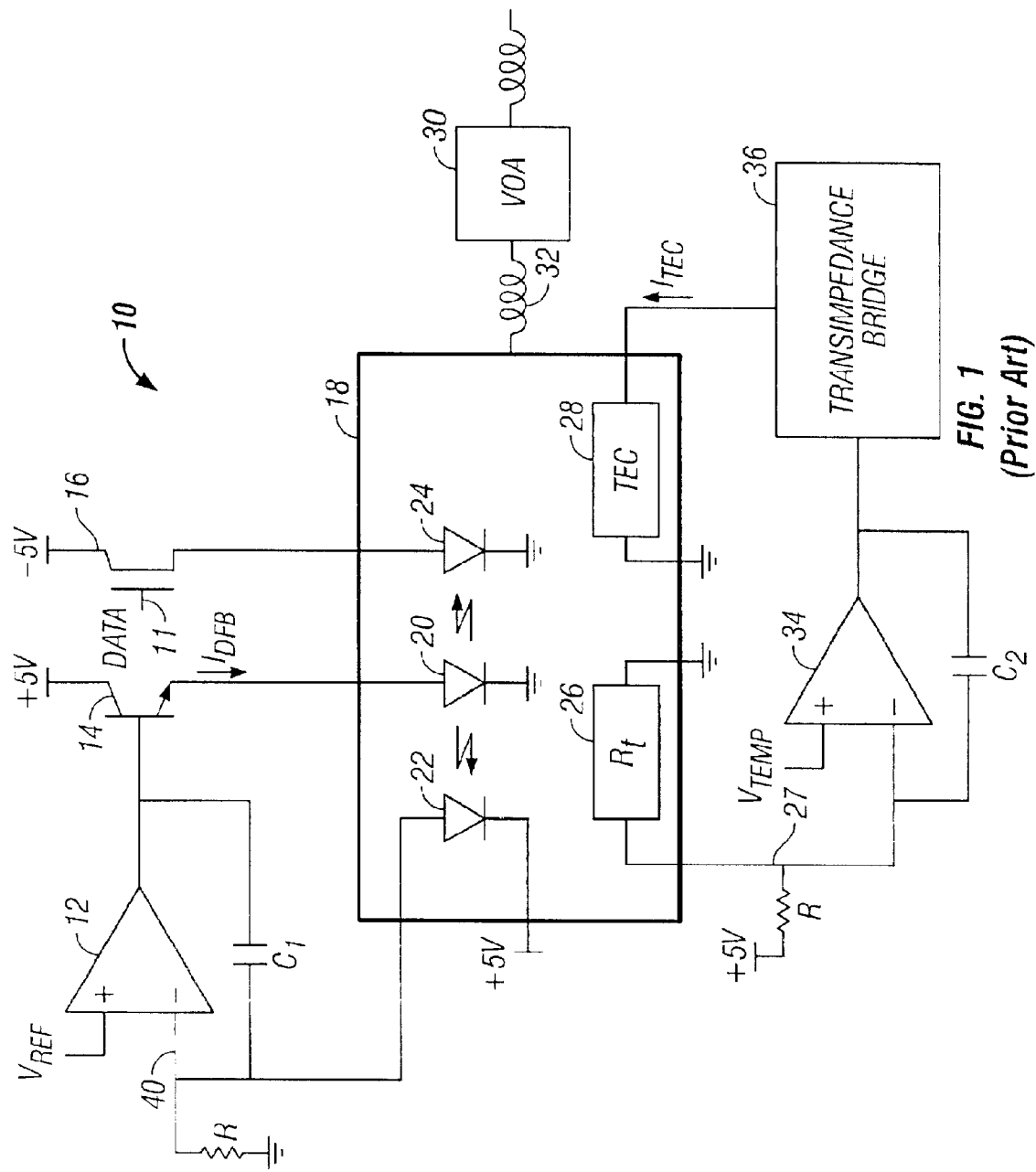
FIG. 1 is a circuit diagram of a laser transmitter of the prior art.

A typical laser transmitter 10 of the prior art is shown in FIG. 1. The laser transmitter includes a laser module 18 coupled to a variable optical attenuator (VOA) 30 via an optical fiber 32. The laser module includes a laser diode 20, a backfacet diode 22 and a modulator 24. The laser diode 20 typically provides a continuous wave output at a constant bias level corresponding to a constant power level. A data stream input 11 is coupled through gate 16 to modulator 24 to modulate the continuous wave output of the laser diode 20. For simplicity the modulator 24 is shown as a diode, though it is understood that it is commonly a Mach-Zhender interferometer or lithium niobate waveguide device. The modulated optical signal is coupled to the optical fiber 32.

The constant power output of the laser diode 20 is controlled using a bias current source and a power monitor loop. The bias current source, which includes operational amplifier 12 and transistor 14, provides an adjustable bias current IDFB to the laser diode. The power monitor loop includes backfacet diode 22 for monitoring the laser diode power output to provide a power monitor signal that is coupled to the negative input of operational amplifier 12. The output of operational amplifier 12 is coupled to the negative input through capacitor C1. The positive input of operational amplifier 12 has a power reference voltage VREF. The operational amplifier 12 adjusts the bias current IDFB responsive to a difference between the power reference VREF and the power monitor signal. For example, if the power monitor signal is less than the power reference VREF, operational amplifier 12 provides more bias current.

To control the operating temperature of the laser transmitter, the laser module 18 includes a thermistor 26 and a thermnal electric cooler (TEC) element 28. Operational amplifier 34 arid transimpedance bridge 36 provide a control current ITEC to the TEC element 28. A temperature monitor loop includes thermistor 26 for monitoring the temperature operation point to provide a temperature monitor signal that is coupled to the negative input of operational amplifier 34. The output of operational amplifier 34 is coupled to the negative input through capacitor C2. The positive input of operational amplifier 34 has a temperature reference voltage VTEMP. The operational amplifier 34 adjusts the control current ITEC to the TEC element 28 responsive to a difference between the temperature reference VTEMP and the temperature monitor signal. For example, if the temperature monitor signal is less than VTEMP, the operational amplifier 34 provides more current to the TEC element.

Direct electrical control of the power output of a laser diode generally is understood to be problematic, given the relationship between operating temperature and wavelength in such devices. In particular, the relationship depends on output power and the characteristics of individual devices.

Figure 2:
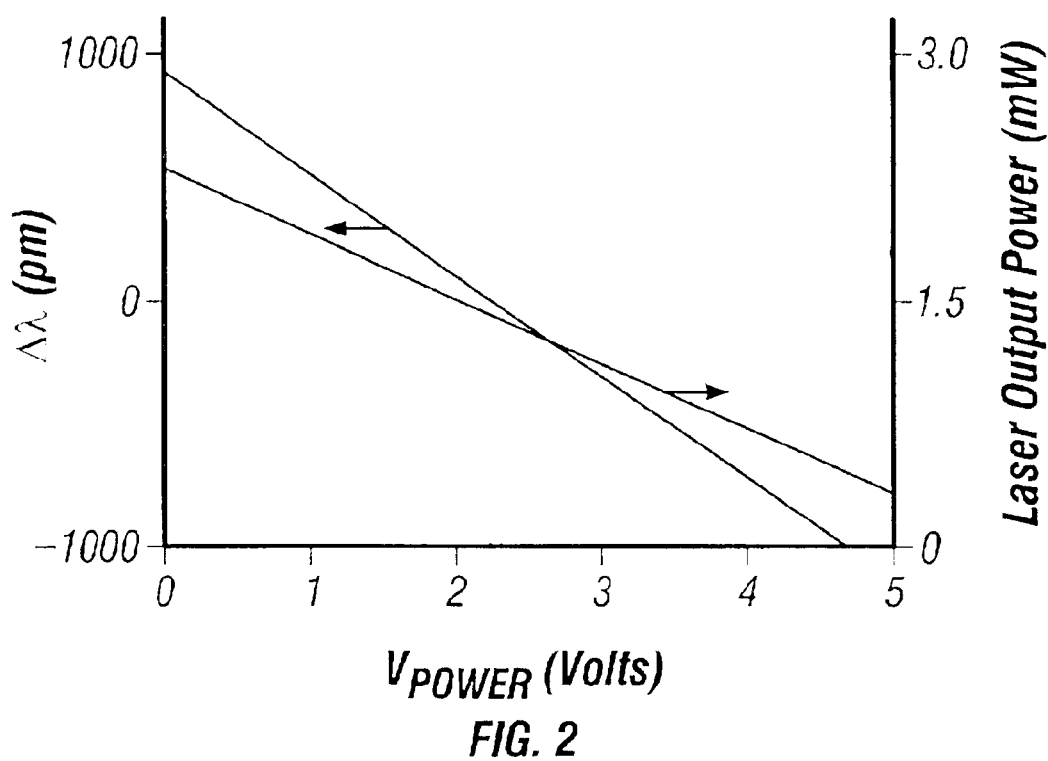
FIG. 2 is a chart that illustrates power control characteristics of the transmitter of FIG. 1.

Referring to FIG. 2, the chart illustrates the effect on operating wavelength when the laser output power is adjusted for the exemplary laser transmitter 10 of FIG. 1. In particular, by applying a voltage VPOWER through a resistor to negative input 40 of operational amplifier 12, the laser output power is adjusted. Note that the temperature control portion of the laser transmitter is kept constant, i.e., VTEMP is constant. The slope of the power adjustment curve (right vertical axis) is negative. That is, an increase in voltage VPOWER results in a decrease in laser output power. A corresponding change Δλ in operating wavelength occurs (left vertical axis) such that a decrease in laser power output results in a shorter operating wavelength.

As shown, a power change from 3.0 mW to below 1.0 mW results in a wavelength shift of about 2000 picometers. In modern dense wavelength division multiplex (DWDM) systems designed for 100 GHz or tighter channel spacings, the channels are only +/−100 picometers wide around a nominal specified center wavelength. Thus, the change in wavelength operation that occurs with the power adjustment shown in FIG. 2 is too large and is unacceptable for modem telecommunication systems.

Figure 3:
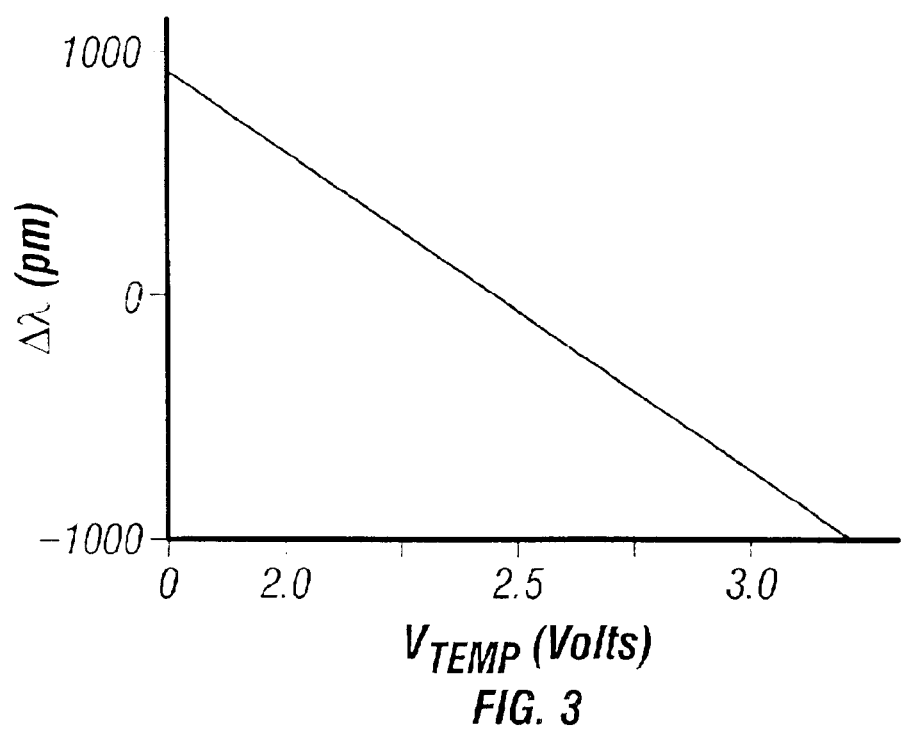
FIG. 3 is a chart that illustrates temperature control characteristics of the transmitter of FIG. 1.

FIG. 3 is a chart that illustrates the effect on operating wavelength when the temperature reference voltage VTEMP is adjusted for the laser transmitter 10 of FIG. 1 while the output power of the laser transmitter and VREF are kept constant. The slope of the curve in FIG. 3 is negative. That is, an increase in temperature reference voltage VTEMP causes the TEC element to operate at a cooler temperature, which results in a shorter operating wavelength for the laser diode. As shown, a change in VTEMP from 2 to 3 volts results in a wavelength shift of about 2000 picometers.

It has been found in the present approach that, by taking into account the wavelength shift due to power adjustment and due to temperature, a power control circuit can be implemented that provides variable laser power output while maintaining operation of the laser diode at a nominal wavelength within an acceptable range.

Figure 4:
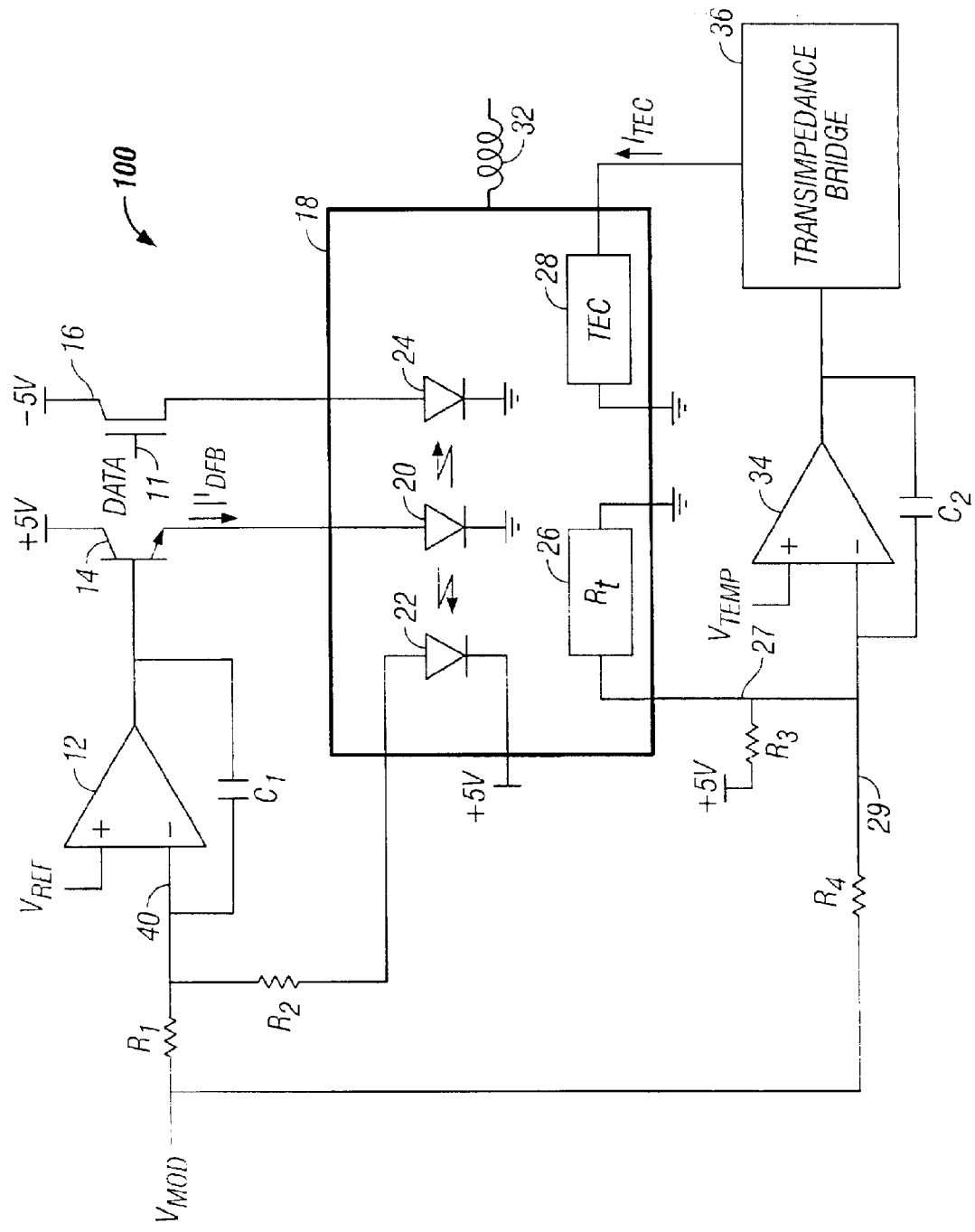
FIG. 4 is a circuit diagram of laser transmitter.

In an embodiment of a laser control circuit 100 in accordance with the present approach shown in FIG. 4, a power control signal VMOD is provided that is added to the power monitor signal through resistor network R1 and R2 at the negative input of operational amplifier 12 so that the operational power level can be increased or decreased over the nominal set point provided by reference voltage VREF. In addition, to compensate for the wavelength shift of the laser diode 22, a scaled version 29 of the power control signal VMOD is provided that is added to the temperature monitor signal 27 through resistor R4 at the negative input of operational amplifier 34. Note that the control circuit 100 eliminates the need for a VOA (FIG. 1). Thus, a simple but elegant solution is provided to solve the problems noted above.

Different laser diode devices can exhibit different temperature and wavelength characteristics. Thus, in the control circuit 100 of FIG. 4, the values for resistors R1, R2, R3 and R4 can be accordingly adjusted to fit the characteristics of each laser diode.

Figure 5:
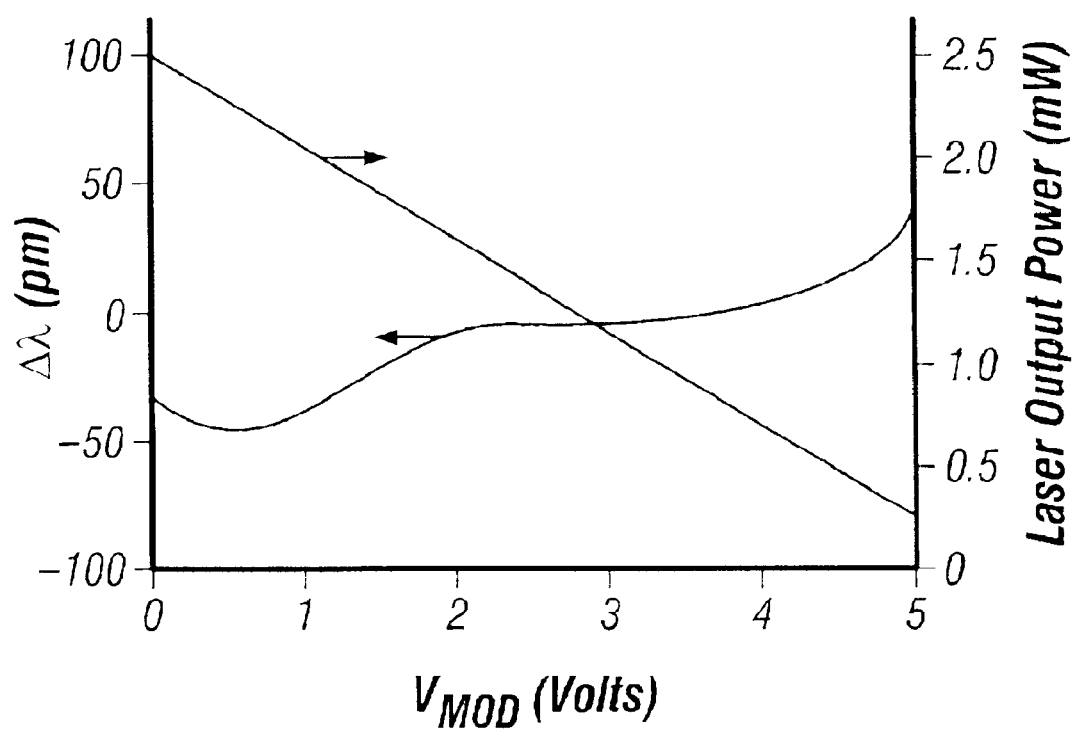
FIG. 5 is a chart illustrating power and wavelength control characteristics of the transmitter of FIG. 4.

As described, the control circuit 100 provides an adjustable output power. FIG. 5 shows the laser output power (right vertical axis) as it varies with the applied adjustment voltage, VMOD. Note that for VMOD of 0V the output power is approximately 2.5 mW. With VMOD of 3V the output power is approximately 1.5 mW. Thus, linear adjustment of output power is provided.

FIG. 5 also shows a residual amount of wavelength variation (left vertical axis) for the control circuit of FIG. 4. Note that for VMOD of 0 V the difference between the intended wavelength and the actual wavelength, given as Δλ, is about 25 picometers. The negative sign indicates that the wavelength is less then the intended wavelength. For VMOD of 4.5 V the difference Δλ is about 0.

As noted above, DWDM system today require tight channel spacings. Without the wavelength control feature provided as shown in FIG. 4, the variation of the laser wavelength as the power is adjusted from 2.5 mW to 0 mW (FIG. 5) will be very much larger than the acceptable variation. With the control circuit of FIG. 4, the residual wavelength variation is well within the acceptable variation.

Figure 6:
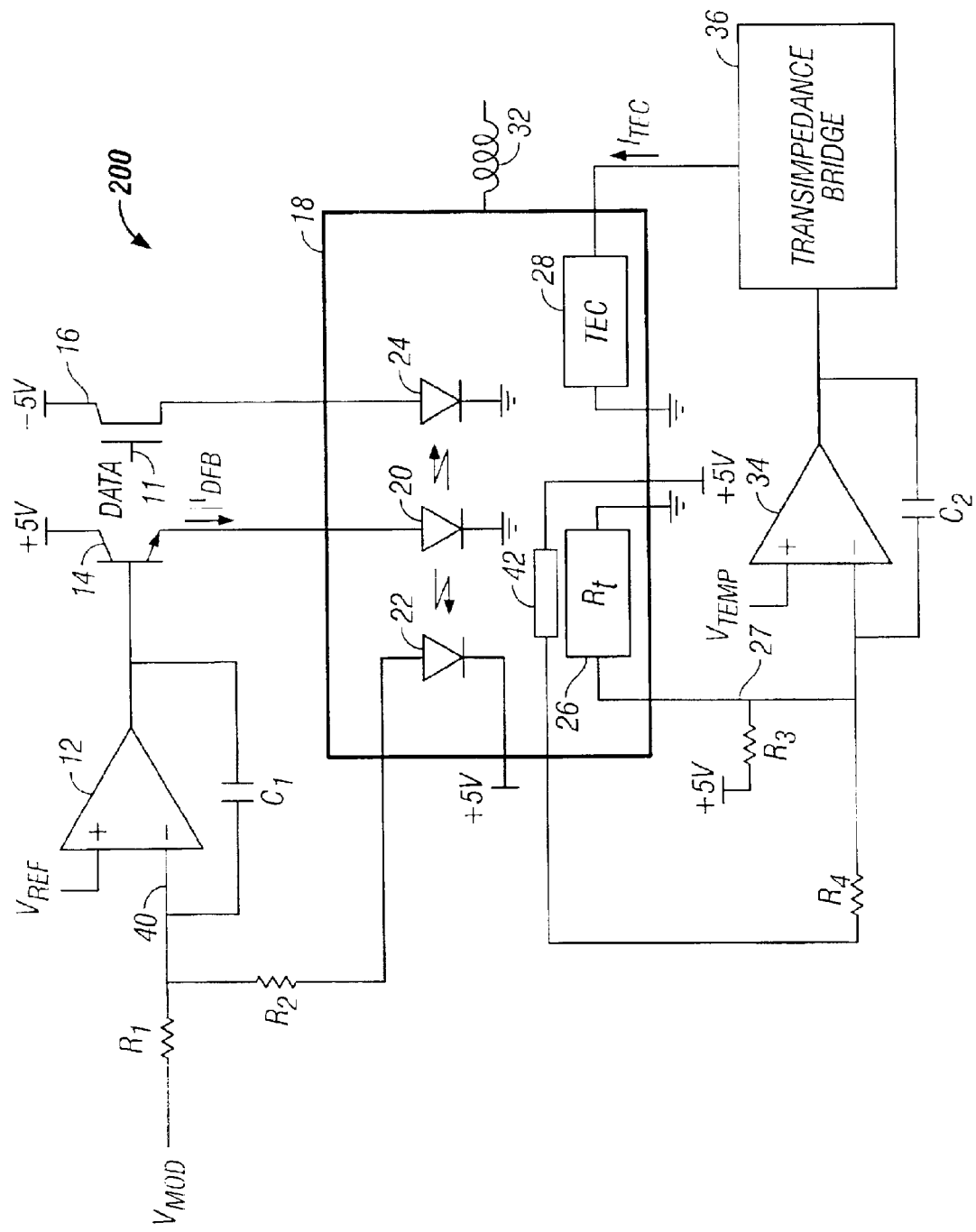
FIG. 6 is a circuit diagram of another embodiment of a laser transmitter in accordance with the present system.

Referring to FIG. 6, a second embodiment of a control circuit 200 is shown. In this embodiment, a Fabry□Perot etalon locker device 42 is used to provide the wavelength compensation. The etalon locker 42 receives light emitted from laser diode 20, and based upon the wavelength of the light received, outputs a signal to add to the negative input of operational amplifier 34 for controlling the wavelength.

Other embodiments for providing wavelength compensation when the output power of a laser diode is varied are within the scope of the claims. For example, in the embodiment described above in conjunction with FIG. 4, the value of resistor R4 was selected to provide the appropriate level of wavelength compensation as the output power of the laser diode is varied. However, in that embodiment, as the laser diode "ages," the bias current needed to provide a given level of output power will no longer be the same, but will increase. The value of resistor R4 may no longer be appropriate for providing the proper level of wavelength compensation.

Figure 7:
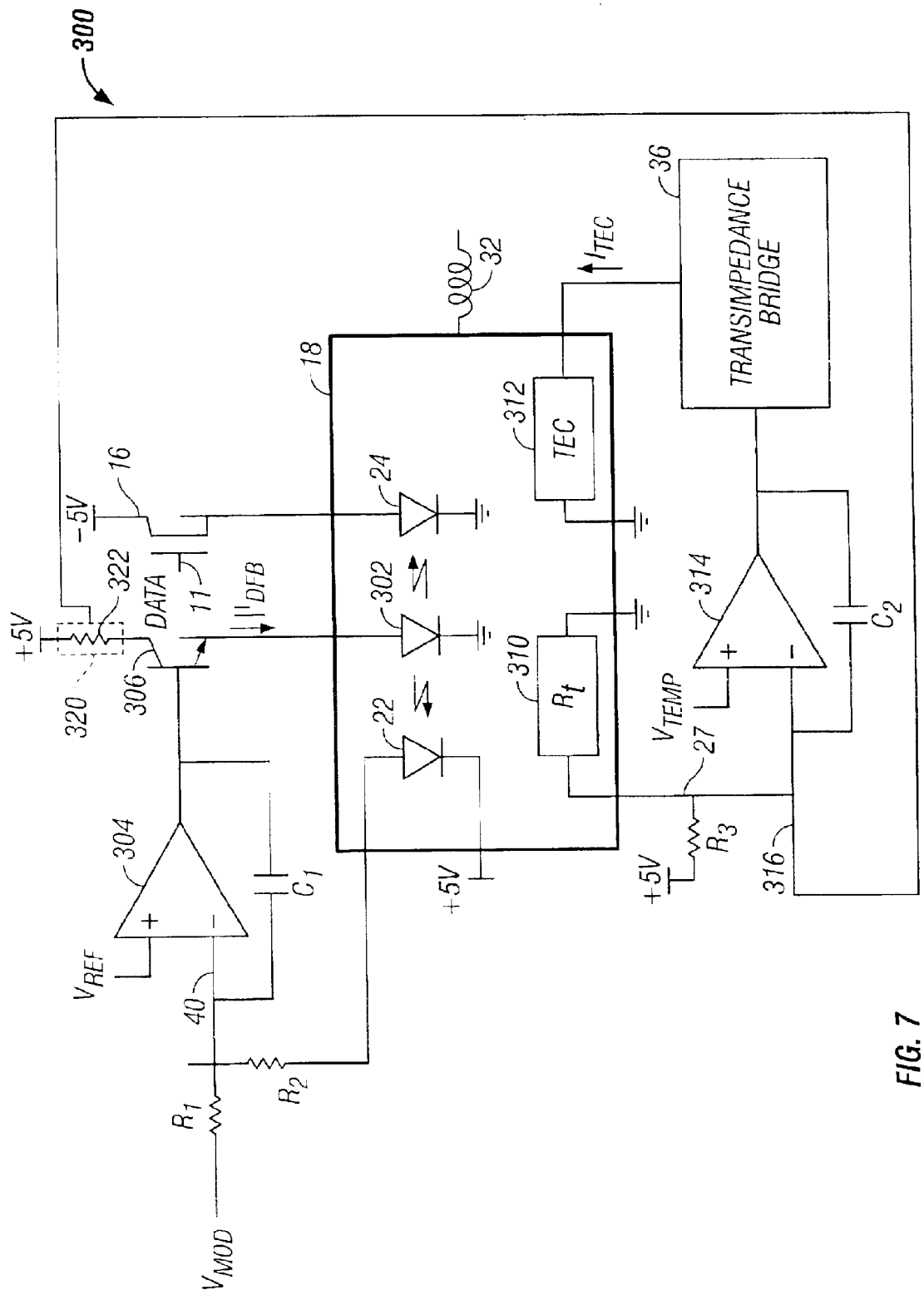
FIG. 7 is a circuit diagram of still another embodiment of a laser transmitter.

However, referring to FIG. 7, a laser diode module 300 provides accurate wavelength compensation even as the characteristics of the laser diode changes. In particular, laser diode module provides for wavelength compensation in response to the change in bias current applied to a laser diode 302. Laser diode module 300 includes many of the same components as the laser circuit shown in FIG. 4. For example, the output power of laser diode 302 is controlled using a bias current source and a power monitor loop. The bias current source includes an operational amplifier 304 and a transistor 306, which together provide an adjustable bias current $I_{DFB}$ to laser diode 302. The power monitor loop includes a backfacet diode 308 for monitoring the output power to laser diode 302 and to provide a power monitor signal that is coupled to the negative input of operational amplifier 304. The output of operational amplifier 304 is coupled to the negative input through capacitor C1. The positive input of operational amplifier 304 has a power reference voltage VREF. The operational amplifier 304 adjusts the bias current $I_{DFB}$ responsive to a difference between the power reference VREF and the power monitor signal. For example, if the power monitor signal is less than the power reference VREF, operational amplifier 304 increases the level of bias current.

As was the case in the embodiment of FIG. 4, laser diode module 300 includes a temperature monitor loop for monitoring the temperature operation point to provide a temperature monitor signal that is coupled to the negative input of an operational amplifier 314. The temperature monitor loop has a thermistor 310 and a thermal electric cooler (TEC) element 312. Operational amplifier 314 and transimpedance bridge 316 provide a control current ITEC to the TEC element 312. The output of operational amplifier 314 is coupled to its negative input through a capacitor C2. The positive input of operational amplifier 314 has a temperature reference voltage $V_{TEMP}$. The operational amplifier 314 adjusts the control current $I_{TEC}$ to the TEC element 312 responsive to a difference between the temperature reference $V_{TEMP}$ and the temperature monitor signal. For example, if the temperature monitor signal is less than $V_{TEMP}$, the operational amplifier 314 provides more current to the TEC element. A power control signal $V_{MOD}$ is added to the power monitor signal through a resistor network R1 and R2 at the negative input of operational amplifier 314 so that the operational power level can be increased or decreased over the nominal set point provided by reference voltage $V_{REF}$. Unlike the embodiment of FIG. 4, however, a scaled version of the power control signal $V_{MOD}$ is not used to compensate for the wavelength shift. Rather, laser module 300 includes a sensing circuit 320 having, in this embodiment, a sensing resistor 322. An output signal of the sensing circuit 320 is provided via signal line 316 to the negative terminal of operational amplifier 314. The output signal from sensing circuit 320 provides a connection between that portion of the laser module associated with automatic power control and that portion of the laser module associate with wavelength compensation.

Thus, the embodiment shown in FIG. 7 is particularly advantageous in applications where the laser module is to be used for extended periods of time. Rather than being proportional to the output power of the laser diode, the wavelength compensation is proportional the bias current.

While this invention has been particularly shown and described with references to preferred embodiments thereof, it will be understood by those skilled in the art that various changes in form and details may be made therein without departing from the scope of the invention encompassed by the appended claims.

What is claimed is:

1. A control circuit for a laser diode comprising:
   a bias current source for providing an adjustable bias current to the laser diode;
   a power controller for adjusting the bias current to the laser diode to change the power output of the laser diode, the power change having a corresponding wavelength shift effect on the nominal operating wavelength of the laser diode;

a sensing circuit for sensing the bias current to the laser diode and generating a feedback signal in response to the sensed bias current; and a temperature control circuit that provides a control current to a thermoelectric element for controlling temperature operation and wavelength operation of the laser diode, wherein the temperature control circuit receives the feedback signal of the sensing circuit and a temperature monitor signal from a temperature sensor of the laser diode and adjusts the control current to the thermoelectric element responsive to the feedback signal of the sensing circuit and the temperature monitor signal such that operation of the laser diode is maintained around a nominal operating wavelength.

2. The control circuit of claim 1 wherein the monitoring circuit includes a sensing resistor.

3. The control circuit of claim 1 wherein the power controller comprises:

a power monitor loop including a backfacet diode for monitoring the laser diode power output to provide a power monitor signal;

a power control signal added to the power monitor signal to provide a power adjust signal;

wherein the bias current source adjusts the bias current responsive to a difference between the power reference voltage input and the power adjust signal.

4. The control circuit of claim 1 wherein the temperature control circuit that provides a control current to a thermoelectric element for controlling temperature operation and wavelength operation of the laser diode, further comprises:

a temperature reference voltage input;

a temperature monitor loop including the temperature sensor for monitoring the temperature operation point of the laser diode and providing the temperature monitor signal;

a wavelength control signal generated in response to the temperature monitor signal and the feedback signal of the sensing circuit;

wherein the temperature control circuit adjusts the control current to the thermoelectric element responsive to a difference between the temperature reference voltage input and the wavelength control signal.

5. The control circuit of claim 1 further comprising:

a modulator for modulating the output of the laser diode.

6. A method of controlling a laser diode, the method comprising:

adjusting a bias current to the laser diode to change the power output of the laser diode, the power change having a corresponding wavelength shift effect on the output wavelength of the laser diode;

sensing the level of bias current to the diode and generating a feedback signal;

monitoring a temperature operation point of the laser diode and generating a temperature monitor signal; and adjusting temperature operation of the laser diode in response to the feedback signal and the temperature monitor signal such that the wavelength output of the laser diode is compensated for the wavelength shift effect.

7. The method of claim 6 wherein the step of adjusting a bias current to the laser diode comprises:

monitoring the laser diode power output to provide a power monitor signal;

adding a power control signal to the power monitor signal to provide a power adjust signal;

adjusting the bias current responsive to a difference between a power reference voltage signal and the power adjust signal.

8. The method of claim 6 wherein adjusting temperature operation of the laser diode comprises:

providing a control current to a thermoelectric element for controlling the temperature operation point of the laser diode;

adding the feedback signal to the temperature monitor signal to provide a wavelength control signal; and adjusting the control current to the thermoelectric element responsive to a difference between a temperature reference signal and the wavelength control signal.

9. A control circuit comprising;

means for adjusting a bias current to a laser diode to change the power output of the laser diode, the power change having a corresponding wavelength shift effect on the nominal operating wavelength of the laser diode;

means for sensing the bias current to the laser diode and generating a feedback signal in response to the sensed bias current;

means for monitoring the temperature operation point to provide a temperature monitor signal; and means for adjusting temperature operation of the laser diode in response to the feedback signal from the sensing means and the temperature monitor signal from the monitoring means such that the laser diode maintains operation at the nominal wavelength.

10. The control circuit of claim 9 wherein the means for sensing includes a sensing resistor.

11. The control circuit of claim 9 wherein means for adjusting a bias current to a laser diode comprises:

a bias current source that provides an adjustable bias current to the laser diode and having a power reference voltage input;

a power monitor loop including a backfacet diode for monitoring the laser diode power output to provide a power monitor signal;

a power control signal added to the power monitor signal to provide a power adjust signal;

wherein the bias current source adjusts the bias current responsive to a difference between the power reference voltage input and the power adjust signal.

12. The control circuit of claim 11 wherein means for adjusting temperature operation of the laser diode comprises:

a temperature control circuit that provides a control current to a thermoelectric element for controlling the temperature operation point of the laser diode and having a temperature reference voltage input;

a wavelength control signal generated in response to the feedback signal of the sensed bias current and the temperature monitor signal;

wherein the temperature control circuit adjusts the control current to the thermoelectric element responsive to a difference between the temperature reference voltage input and the wavelength control signal.

13. The control circuit of claim 12 wherein the wavelength compensation signal is proportional to the sensed bias current.

14. An optical transmitter, comprising:

a laser diode with an input bias signal;

a power control circuit for adjusting the bias current applied to laser diode;

a sensing circuit for sensing the bias current applied to the laser diode and providing a feedback signal proportional to the bias current; and a temperature control circuit for controlling temperature operation and wavelength compensation of the laser diode that comprises:

a temperature reference voltage input;

a temperature monitor loop including a temperature sensor for monitoring temperature operation of the laser diode and providing a temperature monitor signal;

a wavelength control signal generated responsive to the temperature monitor signal and the feedback signal; and a thermoelectric element that adjusts the temperature operation of the laser diode in response to a temperature control signal, wherein the temperature control signal is proportional to a difference between the temperature reference voltage input and the wavelength control signal.

15. The optical transmitter of claim 14, wherein the temperature control circuit further comprises:

an operational amplifier with the temperature reference voltage as a first input and the wavelength control signal as a second input;

a transimpedance bridge with an input connected to the output of the operational amplifier; and wherein the temperature control signal is an output of the transimpedance bridge.

* * * * *